United States Patent [19]
Lin et al.

[11] Patent Number: 5,975,740
[45] Date of Patent: Nov. 2, 1999

[54] APPARATUS, METHOD AND MEDIUM FOR ENHANCING THE THROUGHPUT OF A WAFER PROCESSING FACILITY USING A MULTI-SLOT COOL DOWN CHAMBER AND A PRIORITY TRANSFER SCHEME

[75] Inventors: Zhihong J. Lin, Sunnyvale; Chongyang Wang, San Jose, both of Calif.

[73] Assignee: Applied Materials, Inc., Santa Clara, Calif.

[21] Appl. No.: 08/654,370

[22] Filed: May 28, 1996

[51] Int. Cl.[6] ............................. G06F 19/00; G06G 7/66
[52] U.S. Cl. ............................. 364/468.05; 364/468.08; 364/468.28; 364/478.01; 414/936; 414/937; 414/938; 414/939; 414/940; 414/941; 705/8
[58] Field of Search ................... 364/468.05, 468.08, 364/468.28, 478.01; 414/936–941; 705/8

[56] References Cited

U.S. PATENT DOCUMENTS

| | | | |
|---|---|---|---|
| 4,747,928 | 5/1988 | Takahashi et al. | 204/298.09 |
| 4,836,733 | 6/1989 | Hertel et al. | 414/225 |
| 5,254,170 | 10/1993 | Devilbiss et al. | 414/937 X |
| 5,375,062 | 12/1994 | Aoki | 364/468.05 |
| 5,399,531 | 3/1995 | Wu | 364/468.19 |
| 5,429,642 | 7/1995 | Ohkuma | 29/25.01 |
| 5,440,493 | 8/1995 | Doida | 364/468.05 |
| 5,442,561 | 8/1995 | Yoshizawa et al. | 364/468.06 |
| 5,444,632 | 8/1995 | Kline et al. | 364/468.06 |
| 5,551,830 | 9/1996 | Watanabe et al. | 414/807 |
| 5,612,886 | 3/1997 | Weng | 364/468.07 |
| 5,697,751 | 12/1997 | Takahashi | 414/222 |
| 5,745,364 | 4/1998 | Togashi | 364/468.28 X |
| 5,751,580 | 5/1998 | Chi | 364/468.06 |
| 5,810,935 | 9/1998 | Lee et al. | 118/728 |

FOREIGN PATENT DOCUMENTS

| | | |
|---|---|---|
| 41 12 881 | 11/1991 | Germany . |
| 44 22 683 | 1/1995 | Germany . |
| WO95/17993 | 6/1995 | WIPO . |

*Primary Examiner*—William Grant
*Assistant Examiner*—McDieunel Marc
*Attorney, Agent, or Firm*—Hale & Dorr

[57] ABSTRACT

An apparatus, method and medium is provided for increasing the efficiency with which wafers are transferred among different processing chambers in a wafer processing facility. A multi-slot cooling chamber allows multiple wafers to be cooled while other wafers are subjected to processing steps in other chambers. Each wafer in the processing sequence is assigned a priority level depending on its processing stage, and this priority level is used to sequence the movement of wafers between chambers. A look-ahead feature prevents low-priority wafer transfers from occurring if such transfers would occur just prior to the scheduling of a high-priority wafer transfer.

21 Claims, 7 Drawing Sheets

APPARATUS, METHOD AND MEDIUM FOR ENHANCING THE THROUGHPUT OF A WAFER PROCESSING FACILITY USING A MULTI-SLOT COOL DOWN CHAMBER AND A PRIORITY TRANSFER SCHEME

BACKGROUND OF THE INVENTION

1. Technical Field

This invention relates generally to an apparatus, method and medium for increasing the throughput of a semiconductor wafer processing facility. More particularly, the invention provides various efficiency enhancements for such a facility, including a multi-slot cool down chamber, the use of multiple wafer priority levels to control wafer movement, and a look-ahead scheduling process.

2. Related Information

Automated semiconductor fabrication facilities which employ a single-wafer, multi-chamber design are well known. As one example, the Centura model 5200 sold by Applied Materials, Inc. of Santa Clara, Calif. (see FIG. 1) provides a plurality of chambers arranged around a central processing station which includes a robot arm 101 for moving a silicon wafer 102 between the chambers. Each wafer is stepped through a series of processes (typically one per chamber) which results in the formation of various layers on the wafer which are later used to form a semiconductor device.

As shown in FIG. 1, two load lock chambers 109 and 110 may each include a cassette which forms a plurality of slots (109a and 110a, respectively) for holding a number of wafers. As one example, each cassette may hold 25 wafers. A plurality of processing chambers 104 through 107 each include equipment which performs a processing step on a wafer inserted into the chamber through a corresponding slot (104a through 107a). For example, one process chamber may perform a chemical vapor deposition (CVD) process on a wafer, while another chamber may perform an etching process. A process controller 111, which may comprise a digital computer (such as an embedded Motorola 68040 CPU with a realtime operating system) including sequencing software, may be used to control the timing and movement of wafers through the various chambers to effect the desired process steps on each wafer.

In addition to the process chambers, an orientation chamber 103 may be included to orient each wafer prior to processing. This generally entails finding the center of a wafer inserted into the chamber and passing this center point information to process controller 111 so that robot arm 101 can properly orient the wafer prior to insertion into one of the process chambers. Additionally, a cool down chamber 108 is generally used to allow wafers to cool down between processing steps or after processing is completed.

In general, process controller 111 causes robot arm 101 to remove wafers from a load lock chamber 110, orient the wafer in chamber 103, move the wafer through one or more of the process chambers 104 through 107 according to a timed "recipe" for the wafer, cool down the wafer in cool down chamber 108, and place the processed wafer into a load lock chamber 109. Depending on the particular "recipe", a wafer may be moved from load lock 110 to process C (chamber 107), then to process A (chamber 106), then cooled down (chamber 108), then moved back to process C again (chamber 107), cooled down again (chamber 108), then moved to load lock 109. Of course, more than one wafer may be processed simultaneously if the steps are properly synchronized.

Each wafer which is dispensed from load lock 110 may be stepped through the same process steps to produce the same type of wafer. Alternatively, different wafers from the same load lock may be programmed to undergo a different "recipe" involving different steps and/or process times, such that different types of wafers are produced.

A bottleneck has been found to occur in the conventional wafer processing method described above when multiple wafers are simultaneously processed in an overlapping sequence. This bottleneck has been found to occur at the cool-down chamber 108. This cool-down chamber is needed primarily to prevent damage to load lock chamber 109 after heating a wafer in one of the processing chambers 104 through 107, and also to cool down wafers between certain processing steps. However, the wafer processing steps are relatively short compared with the time required in cool down chamber 108, thus causing the cool down chamber to limit the throughput of the entire apparatus. The fact that the conventional cool down chamber only has a single slot for holding a wafer also contributes to this bottleneck.

In addition to the bottleneck caused by the cool down chamber, conventional wafer scheduling techniques generally contemplate moving wafers sequentially based on their wafer identification number (i.e., the first wafer to be removed from load lock 110 will be deemed wafer #1, the second one will be deemed wafer #2, etc.) rather than on the status of the wafer process itself. The present inventors have found that this scheduling paradigm also results in a loss of efficiency.

For example, if wafer #1 is in process B (chamber 105) and is ready to be moved to cool down chamber 108, while at the same time wafer #2 is in load lock 110 and ready to be moved into process D (chamber 104), the conventional scheduler will first move wafer #1 to the cool down chamber. However, for reasons which will become evident shortly, this may not be as efficient as first moving wafer #2 into process D (chamber 104) prior to moving wafer #1 to the cool down chamber. Thus, potential efficiency is lost.

The above-described inefficiency is presented by way of simplified illustration in FIG. 2. In FIG. 2, time periods are indicated on the horizontal axis and each potential processing step is shown on the vertical axis. Each numbered circle represents a single wafer, and arrows between circles represent wafer movement between chambers by way of a robot arm.

Suppose, for example, that a first wafer (wafer #1) is to be subjected to process A for one time period, process B for three time periods, then a cool down period before being moved out of the processing sequence. The aforementioned sequence constitutes the "recipe" for this wafer.

Assume that a second wafer (wafer #2) is to be subjected to process A for three time periods, process C for four time periods, then a cool down period. Other wafers #3 and #4, after being removed from a load lock cassette, will be subjected to similar processing sequences.

As can be seen at time period 0 in FIG. 2, the robot arm first moves wafer #1 into the chamber which performs process A (step 200). Next, after a single time period, the robot arm moves wafer #1 from process A to process B (step 201). Thereafter, wafer #2 is removed from the load lock area and moved into process A (step 202) where it remains for three time periods.

At time period 4, wafer #1 is ready to be moved to the cool down chamber, which occurs in step 204. Thereafter, in step 205, wafer #2 is moved to process C, where it remains for four time periods. Then, at time period 7, wafer #1 is ready to be moved out of the cool down chamber, and this step occurs as indicated at 207. However, it would have been more efficient at time period 7 to bring another new wafer into one of the processing chambers prior to removing cooled wafer #1 (i.e., there is no inefficiency in delaying the removal of a cooled wafer). As can be seen in step 208, wafer #3 is not brought into process A until time period 8 because of the movement of cooled wafer #1 in step 207. This inefficiency causes a decrease in wafer throughput.

Continuing with the scenario of FIG. 2, at step 209 wafer #2 is moved from process C to the cool down chamber. However, at the same time, wafer #4 could have been brought into process B, since that chamber was available and ready for use. Thus, step 210 (movement of wafer #4 into process B) was unnecessarily delayed for at least one time period. This sequence (moving a processed wafer before an unprocessed or "virgin" wafer) illustrates another inefficiency of conventional wafer processes.

Various manifestations of the aforementioned problem are illustrated more generally in FIG. 3, which is not intended to mirror the example shown in FIG. 2. In FIG. 3, wafer group 301 represents the order in which each wafer has (or will) complete its processing and is ready to be moved to its next chamber. Thus, for example, wafer #2 is the first wafer which will have completed its process step, which occurs prior to the process subjected to wafer #1. In other words, this sequence represents the order in which wafers will become idle (and thus waste time) if not moved.

However, as shown in movement queue 302, conventional wafer sequencing processes typically wait until wafer #1 is ready to move before moving wafer #2. One reason for doing this is to ensure, for example, that deadlock situations do not occur which might disrupt the wafer processing sequence. In other words, blindly moving wafers based on their order of process step completion (order 301) could result in havoc because situations may arise where all chambers are full and none will become available because the sequencer will forever wait for an empty chamber. Even leaving one chamber empty will not solve this problem, particularly for sequences which require different recipes for different wafers. Moreover, certain wafer recipes require that a wafer "revisit" a chamber for further processing after completing another process step. The simple wafer movement ordering shown in 302 thus avoids these problems.

The conventional approach of moving wafers on the basis of wafer identification numbers also ensures that the earliest wafers in are the earliest wafers out. While this straightforward scheme avoids many problems, it also results in inefficiencies for the reasons outlined above.

Yet another inefficiency inherent in conventional wafer scheduling techniques concerns delaying a soon-to-be-scheduled wafer movement because of latency in the robot arm movement. For example, the wafer movement mechanism 101 may require, e.g., 8 seconds to move a wafer from one chamber to another chamber. If a relatively low priority wafer movement begins (e.g., moving a cooled wafer) which occupies the mechanism for 8 seconds, other more important wafer transfers which are scheduled to begin in less than 8 seconds (e.g., moving a wafer between two processes) may be delayed. Thus, efficiency is again compromised.

Finally, load locks 109 and 110 may comprise an elevator mechanism which moves the cassettes up or down to be aligned with robot arm 101. Conventional techniques for moving wafers between load locks and other chambers generally involve sequentially commanding the robot arm to move to the load lock, followed by a command to raise or lower the elevator to move the load lock into proper alignment position. This sequential positioning arrangement wastes time because the elevator movement mechanism, like the wafer movement mechanism, involves a latency on the order of seconds which is added to the robot arm movement time.

Thus, conventional wafer scheduling techniques leave much room for efficiency improvement.

SUMMARY OF THE INVENTION

The present invention increases the efficiency of conventional single-wafer processor scheduling systems. In various embodiments, the present invention contemplates providing a multi-slot cool down chamber which allows more than one wafer to be simultaneously cooled down in a stacked configuration. Additionally, a wafer prioritization scheme classifies wafers based on their processing completion stage, and schedules their sequential movement based on their priority. A sequencer look-ahead feature overcomes problems caused by robot arm movement initiations which occur shortly prior to process expiration times for other wafers. Finally, an elevator movement command can be initiated prior to movement of the robot arm to minimize the amount of time required to align the robot arm with a slot in a wafer storage slot. Other features and advantages will become apparent through the following detailed description, the figures, and the appended claims.

DETAILED DESCRIPTION OF THE PREFERRED EMBODIMENTS

Figure 4:
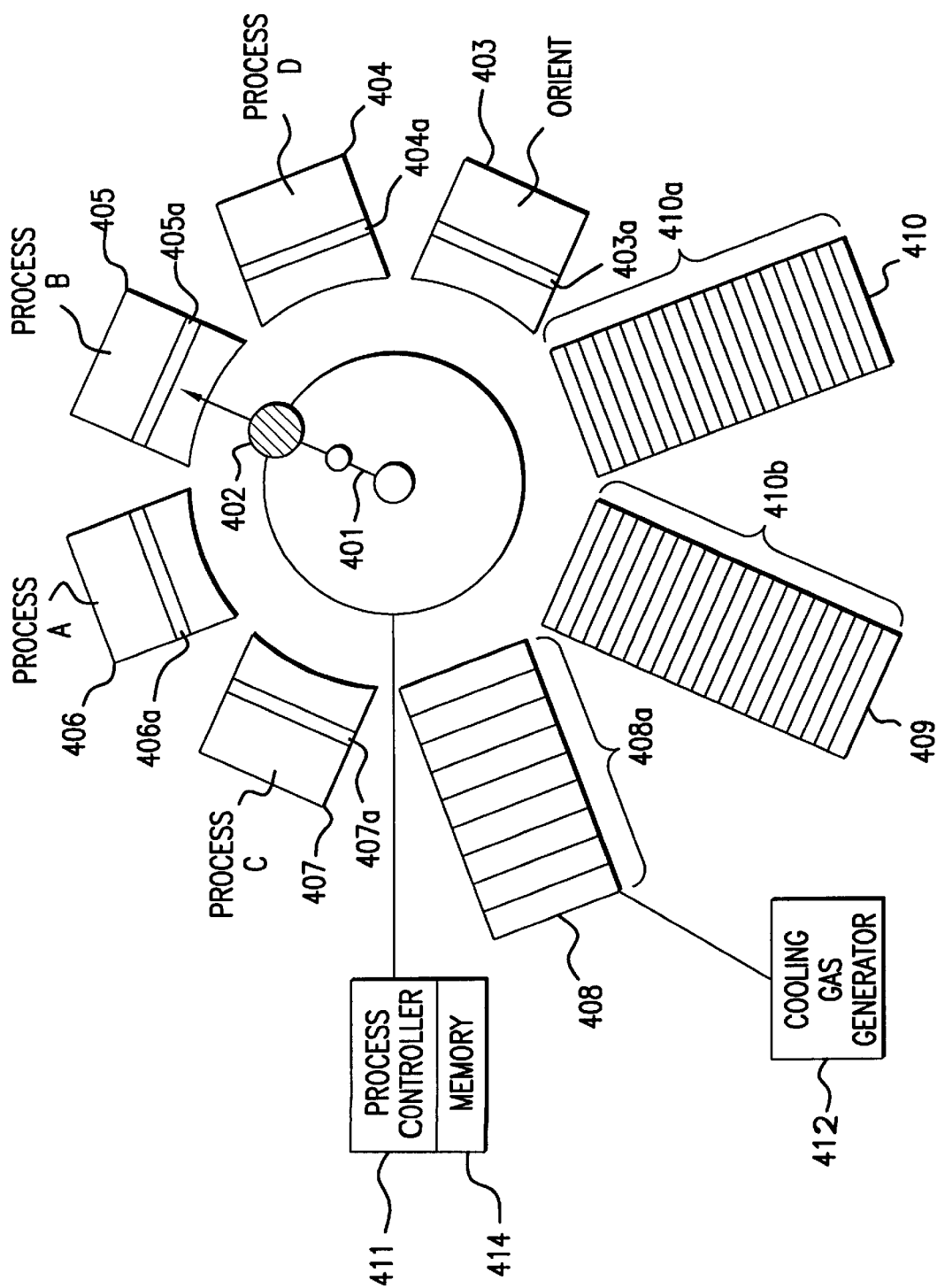
FIG. 4 shows an improved wafer scheduling and processing apparatus including a multiple slot cool down chamber 408 and cooling gas generator 412.

FIG. 4 shows an improved wafer scheduling and processing apparatus employing various principles of the present invention. In FIG. 4, a multiple slot cooling chamber 408 includes a plurality of slots 408a into which wafers may be stored for cooling. An elevator mechanism may be used to move cooling chamber 408 up and down in order to position one of the slots in alignment with robot arm 401 to receive or dispense a wafer such as wafer 402. An optional cooling gas generator 412 may be coupled to multi-slot cooling chamber 408 to provide a cooling gas which increases the cooling rate.

Process controller 411 controls the movement of wafers through various process steps and into an available slot in cooling chamber 408. Since more than one slot is provided in cooling chamber 408, more wafers can be simultaneously cooled, thus increasing the throughput and avoiding bottlenecks caused by waiting for the cooling chamber. Process controller 411 may comprise a general purpose digital computer including a computer program having data structures which maintain the status of each slot in cooling chamber 408. The computer program may be written in C, for example, and stored in memory 414, which may comprise RAM, removable or non-removable magentic or optical storage media, or any number of other types of computer-readable media.

In accordance with various aspects of the invention, each wafer which is processed in the system of FIG. 4 may be assigned a priority level in process controller 411 which determines the order in which robot arm 401 will move the wafer relative to other wafers which may be moved. One possible priority scheme is illustrated in the table below:

| WAFER TYPE | PRIORITY | DESCRIPTION |
| --- | --- | --- |
| dummy wafer | 0 | make sure chamber is cleaned when count is triggered |
| revisit wafer | 1 | avoid deadlock |
| unprocessed wafer | 2 | load process chamber ASAP |
| unprocessed oriented wafer | 2 | load process chamber ASAP |
| processed wafer | 3 | unload process chamber |
| cooled wafer | 4 | lowest priority |

According to the above priority scheme, the highest movement priority (priority 0) will be given to a dummy wafer. A dummy wafer is a wafer used to clean a chamber after a certain number of process iterations have occurred in that chamber. For example, the process may be run with different parameters on a dummy wafer to remove deposits from the chamber walls. After processing, dummy wafers may be moved into a special storage area (not shown) for later analysis or further use. Thus, if more than one wafer is ready to be moved and the destination chambers for those wafers are available, any dummy wafers will be moved first.

The next highest priority (priority 1) will be given to a "revisit" wafer, which is defined as a wafer currently waiting to move into an occupied process chamber (i.e., it must "revisit" another chamber). For example, a wafer which is moved into process A (chamber 406), then moved into process B (chamber 405), then moved into cooling chamber 408, then ready to be moved back into process A for further processing, may be prevented from moving back into process A due to the presence of another wafer in that chamber. In this case, the wafer will be classified as a "revisit" wafer and will take priority for movement over all other wafers other than a dummy wafer. Another example would be a wafer which must go through process steps A, B, then C. After moving through steps A and B, suppose the wafer must wait in chamber B until another wafer has been removed from process chamber C. While it is waiting, it will be classified as a "revisit" wafer. This arrangement is desirable to prevent so-called "deadlock" which might otherwise occur by improperly filling up all available chambers.

The next higher priority level (priority 2) can be assigned to unprocessed wafers, including those which have been oriented. (Note that some systems will not have an orientation chamber). The purpose of this priority assignment is to encourage the loading of process chambers at the earliest possible opportunity (e.g., such a movement would take precedence over moving a cooled wafer).

Figure 1:
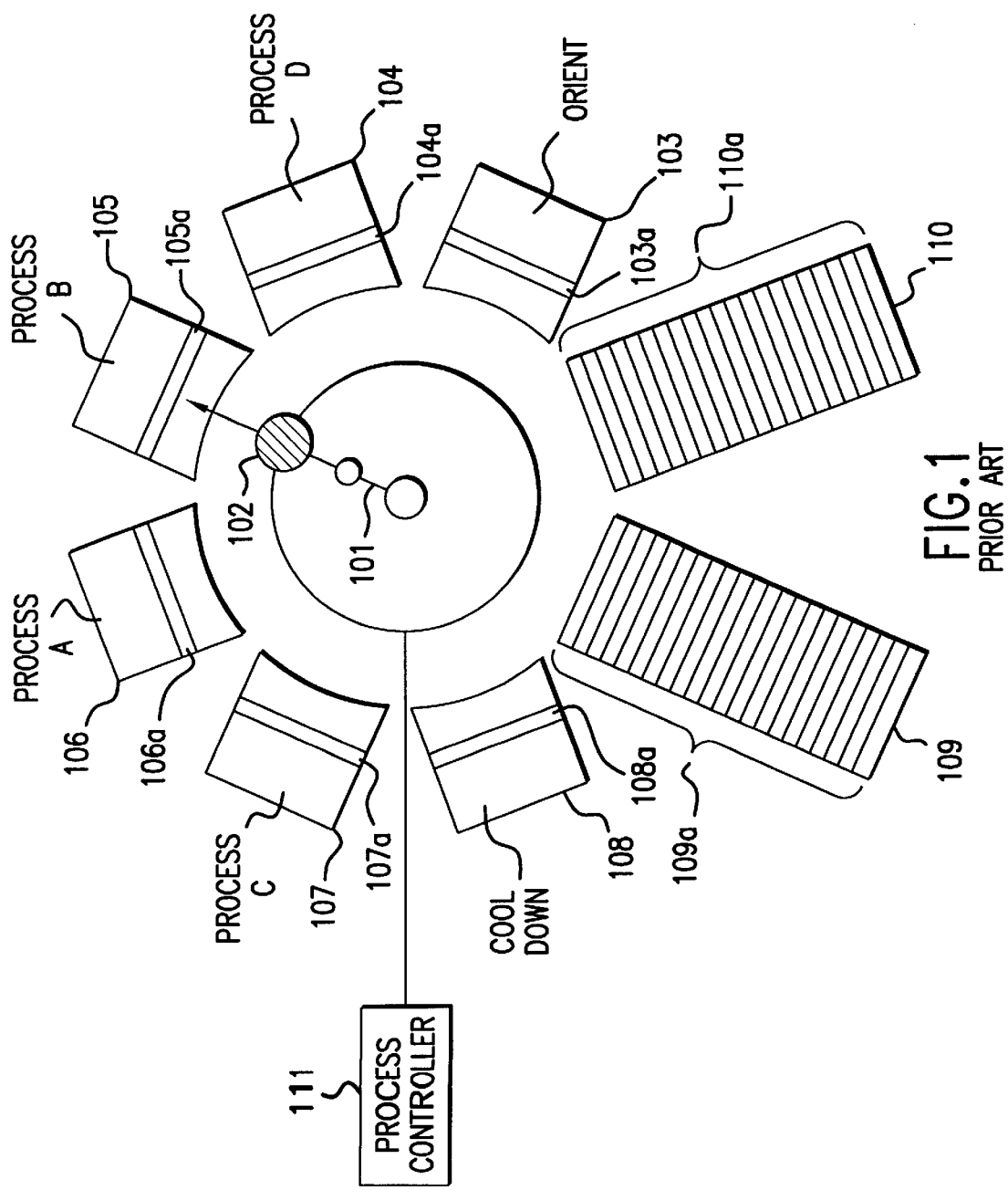
FIG. 1 shows a conventional single-wafer scheduling and processing apparatus including a single slot cool down chamber 108.
Figure 2:
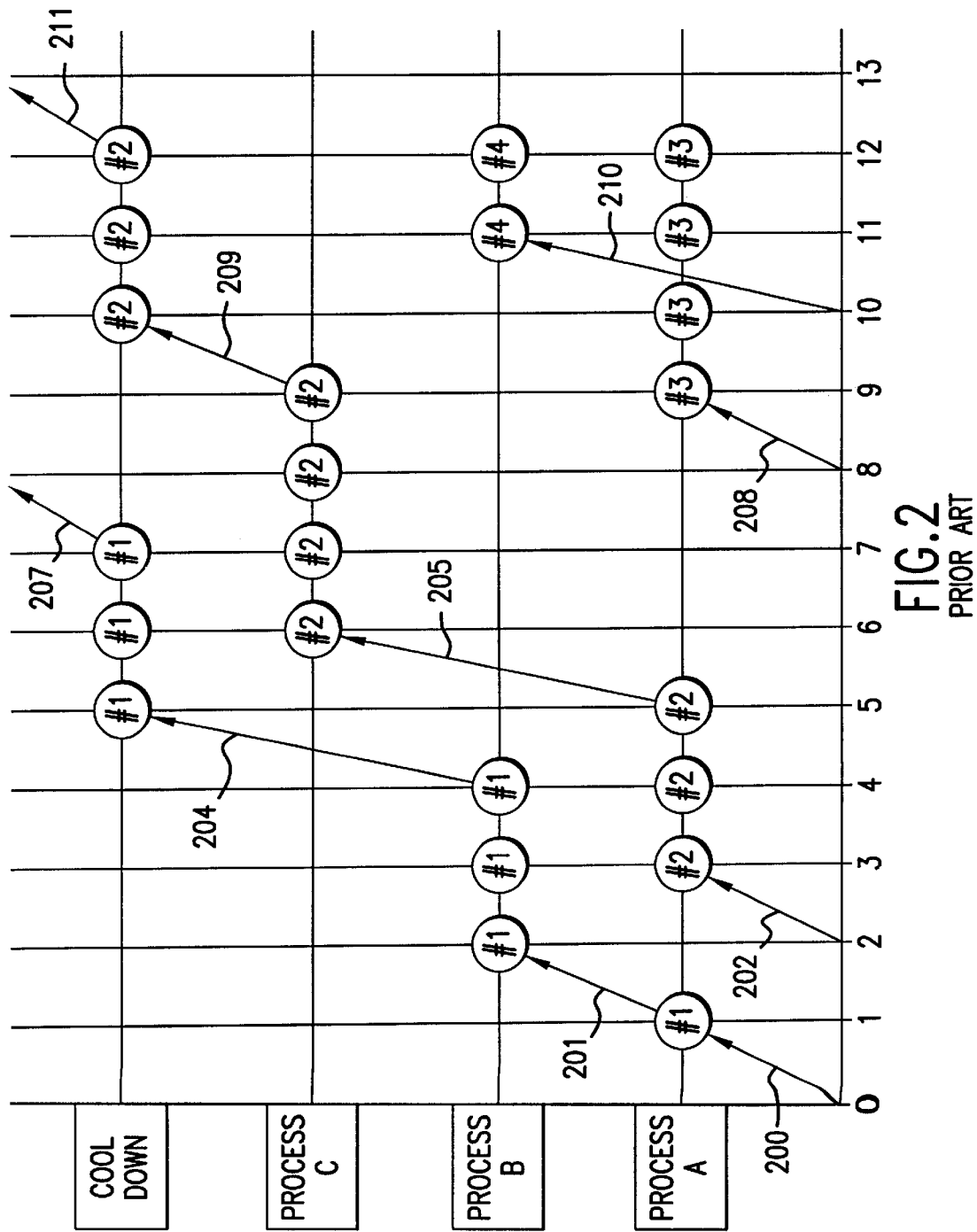
FIG. 2 shows a conventional sequencing process for moving multiple wafers among different processes through the use of a single movement mechanism.

Priority level 3 can be assigned to a processed wafer which is ready to be unloaded from a process chamber but which does not qualify as a "revisit" wafer. For example, a wafer which is scheduled to be cooled would be assigned priority level 3, which would allow an unprocessed wafer to be loaded into a process chamber before the wafer to be cooled is moved into the cool down chamber. This avoids the problem illustrated at step 209 in FIG. 2, wherein wafer #2 (to be cooled) is moved into the cool down chamber before wafer #4 (unprocessed) is moved into process chamber B.

Finally, priority level 4 can be assigned to a cooled wafer. Because various embodiments of the invention include a multi-slot cool down chamber, more than one wafer may be in this state. These wafers would not be moved out of the cool down chamber unless all other wafers were currently being processed, with certain exceptions to prevent deadlock (discussed below). In the event of a priority tie, wafers could be selected (for example) on the basis of a first-in, first-out approach.

Another efficiency improvement contemplated by the present invention involves a sequencer "look ahead" feature. As explained previously, conventional wafer scheduling techniques can delay an impending wafer movement because of latency in the wafer movement mechanism. Thus, for example, if a wafer movement mechanism requires 8 seconds to move a wafer between chambers, and a low priority wafer transfer begins, another wafer which is scheduled to be completed in a process chamber in less than 8 seconds cannot be moved until completion of the lower-priority wafer transfer. For example, if a low priority wafer transfer begins and, 2 seconds into the move, a high priority wafer transfer is ready for scheduling, the high priority transfer will be delayed for 6 seconds.

The present invention contemplates providing a sequencer look-ahead feature which, prior to performing a wafer transfer for a cooled wafer, evaluates the processing time remaining for other wafers in the process chambers and, if the remaining time for any of the other wafers is less than that for the cooled wafer, delaying the cooled wafer transfer. This ensures that an upcoming high priority wafer transfer is not delayed by the start of a lower-priority transfer. Optimally, transfers of cooled wafers would only occur while processing of other wafers is underway and when there is no possibility that the processing of the other wafers will be completed prior to the transfer of the cooled wafer. Certain exceptions to this rule are necessary to prevent a deadlock situation in which the cool down chamber becomes full, as explained in more detail below.

Figure 5:
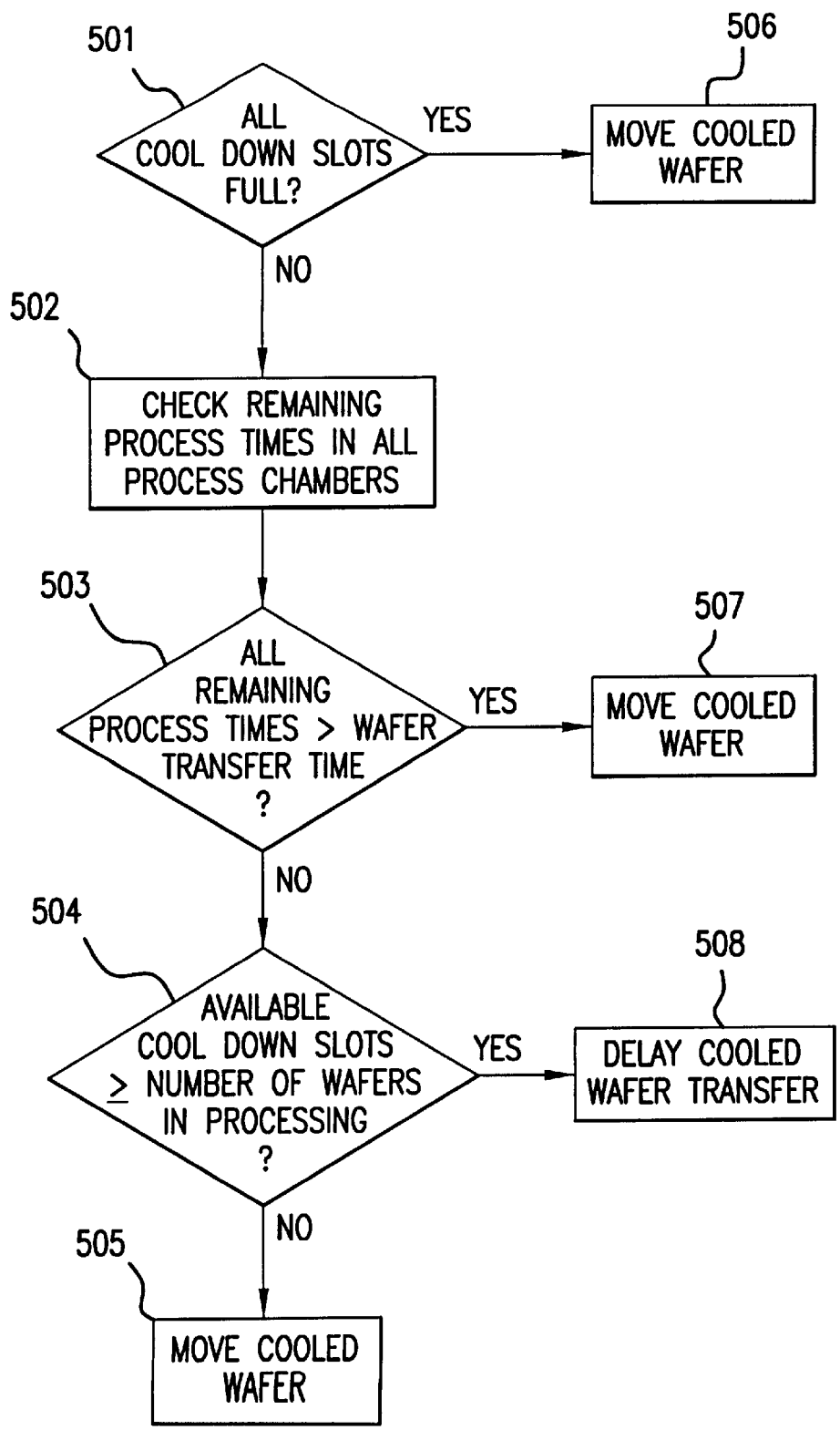
FIG. 5 shows one possible decision strategy for a look-ahead sequence process which avoids transfers of cooled wafers if a higher priority transfer will shortly be scheduled.

One possible approach for implementing the look-ahead feature is to activate a look-ahead process prior to executing a scheduled wafer transfer whenever there is a cooled wafer in the cool down chamber, unless the cool down chamber is full. FIG. 5 shows one possible decision strategy for this look-ahead process. As shown in FIG. 5, in step 501 a first test is performed to determine whether all slots in the cool down chamber are full. If so, then in step 506 the cooled wafer is moved. This avoids a deadlock situation which might cause the chambers to become "backed up".

In step 502, if there is at least one empty slot in the cool down chamber, the process times remaining for all process chambers are checked. Then, in step 503, a test is performed to determine whether all of the process times remaining are greater than the wafer transfer latency (typically an empirically determined constant value which may be different depending on the source and destination chambers for the transfer). If all remaining process times are greater than the wafer transfer time, then in step 507 the cooled wafer is transferred out of the cool down chamber. In this case, no efficiency is lost because no other transfers in the system are possible.

In step 504, assuming that at least one of the remaining process times is less than the wafer transfer latency, a test is made to determine whether the number of slots remaining in the cool down chamber is greater than or equal to the number of wafers currently being processed. If so, then in step 508 the cooled wafer transfer is delayed (i.e., its position in a transfer queue is pushed back). Otherwise, in step 505, the cooled wafer is moved.

Figure 3:
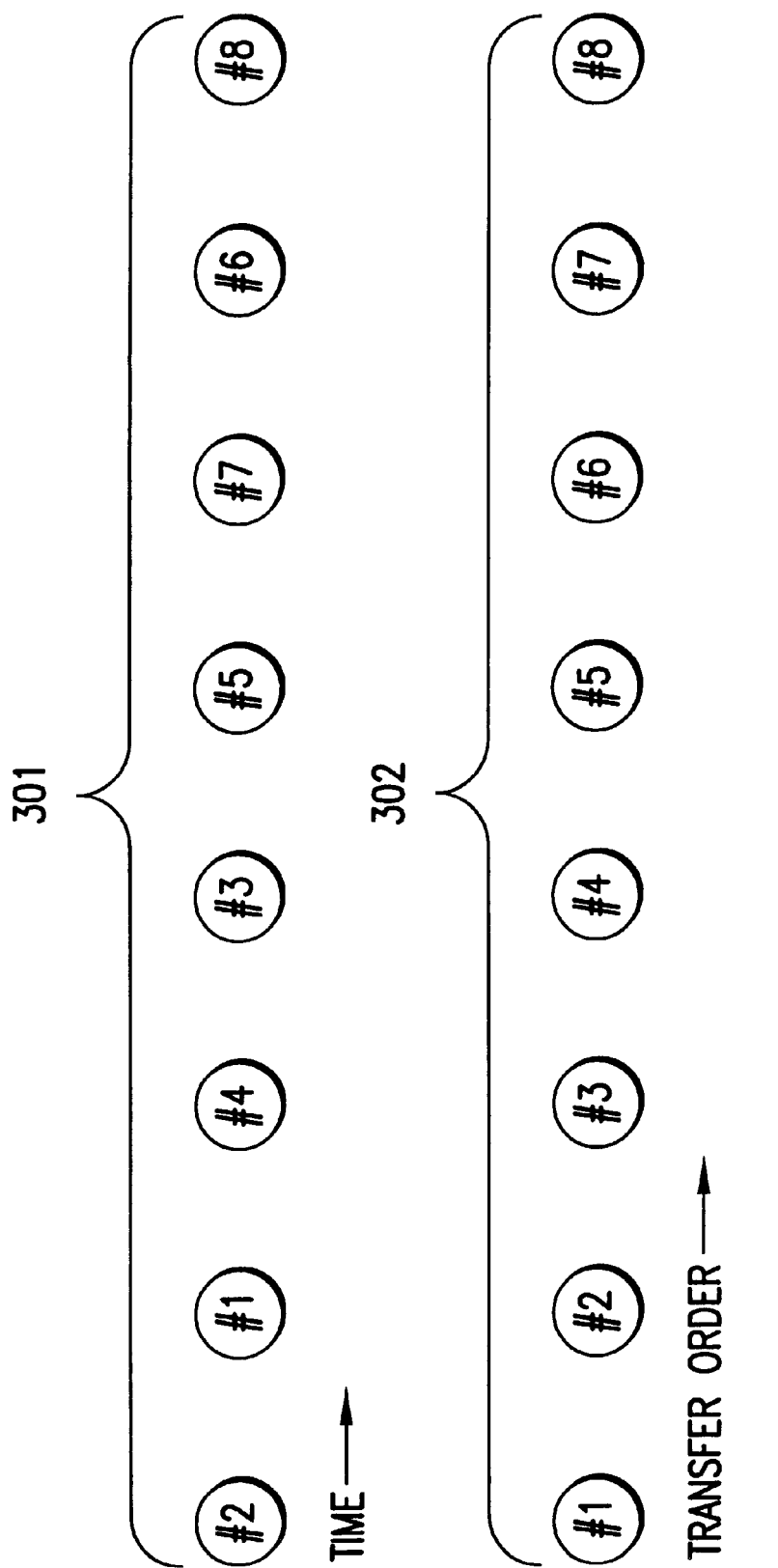
FIG. 3 illustrates a conventional wafer movement process which is based on wafer identification number.
Figure 6:
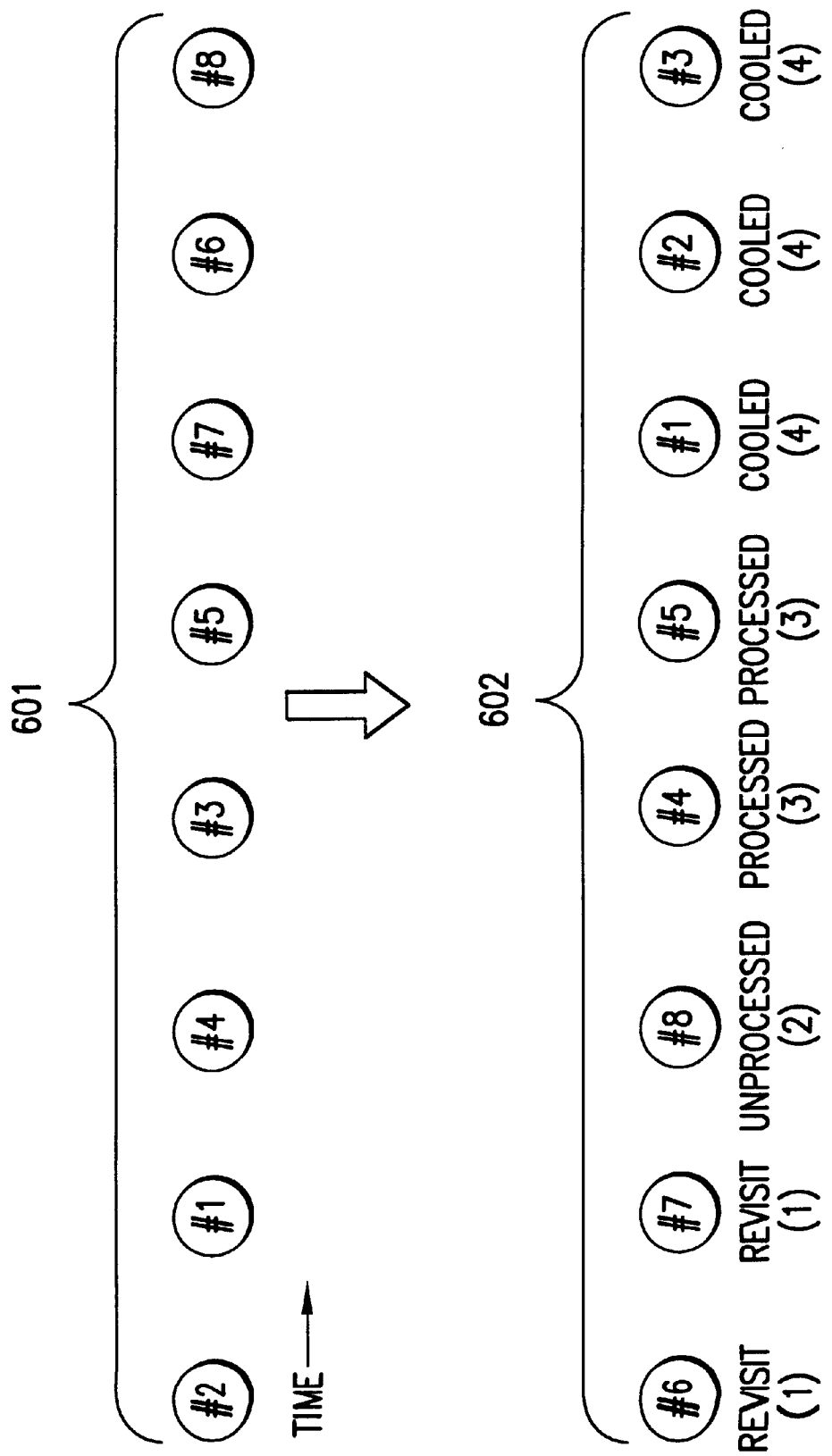
FIG. 6 shows an improved wafer movement scheduling process which classifies wafer priorities according to their processing completion stage and sequences their movement according to priority.

FIG. 6 illustrates how the above described wafer prioritization scheme and look-ahead strategy can be used to sequence wafer transfers. As shown in FIG. 6, group 601 represents the order in which each wafer in an exemplary sequence has (or will) complete its processing in a chamber. In contrast to the conventional wafer movement scheme shown in FIG. 3, however, a different sequencing of wafer transfers 602 is obtained by applying various principles of the present invention. In particular, as shown in FIG. 6, wafers #6 and 7 are now at the head of the transfer queue, because they have been assigned priority level 1 in view of their need to move into a presently occupied chamber. Wafer #8, which has not yet been processed, will be the next scheduled transfer due to its priority level of 2. Processed wafers #4 and 5 will thereafter be transferred due to their priority level of 3. Finally, wafers #1, 2, and 3, which are cooled wafers, will be transferred after all the other wafers have been transferred.

The above example assumes that the cooling chamber includes enough slots to contain at least 8 cooled wafers. Thus, for example, if only two empty slots were available in the cool down chamber, then the steps shown in FIG. 5 could cause a cooled wafer transfer prior to the other transfers (note steps 507, 508, and 506).

As shown in FIG. 4, cool down chamber 408 may be coupled to a cooling gas generator 412 which may be used to increase the cooling rate of wafers in the cooling chamber.

Figure 7:
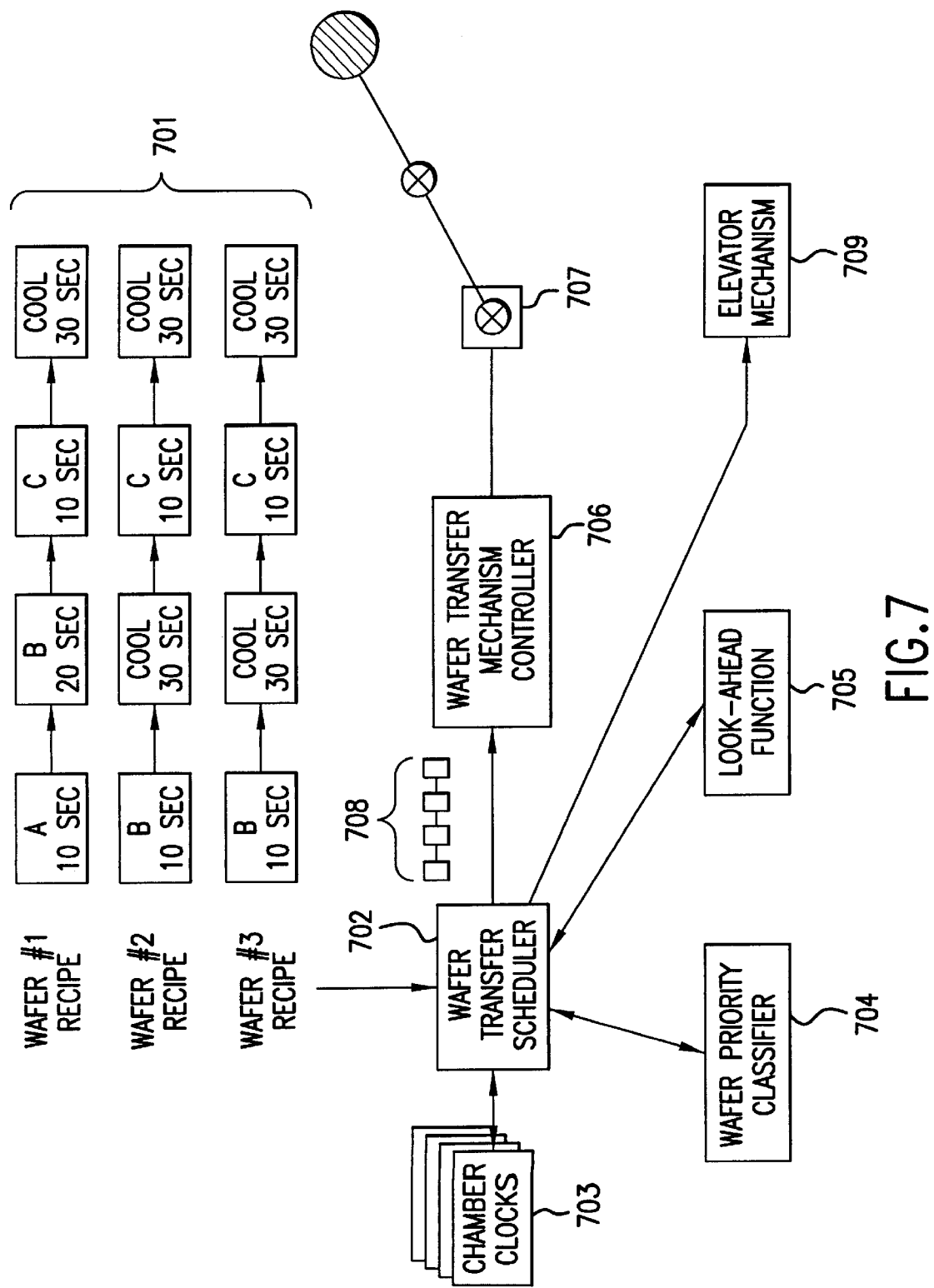
FIG. 7 shows a computer implemented process for carrying out various principles of the present invention.

FIG. 7 shows diagrammatically one possible approach for implementing various computer implemented processes described above. A plurality of wafer recipes 701 each including a list of sequential processes and corresponding process times are input to a wafer transfer scheduler 702 which also maintains chamber clocks 703 and associated information for coordinating each processing step, as is well known in the art. However, wafer transfer scheduler 702, unlike conventional systems, makes use of a wafer priority classifier 704 which classifies each wafer according to its stage of process completion. Based on this classification, wafer transfer scheduler 702 sorts scheduled wafer transfers according to priority level as described with respect to FIG. 6, thus producing a stream of wafer transfer commands 708 to wafer transfer mechanism 707. Additionally, when a cooled wafer is scheduled to be transferred, a look-ahead function 705 is used to determine whether further re-sorting of the wafer transfer list is warranted, as described with reference to FIG. 5. Thus, wafers are transferred in accordance with the optimizations outlined previously.

A final efficiency enhancement concerns the coordination between the wafer movement mechanism 707 and elevator mechanism 709 which may be included with any of the multi-slot devices shown in FIG. 4 (e.g., load lock chambers 409 and 410, and cooling chamber 408). In particular, rather than commanding wafer transfer mechanism controller 706 to move a waver to a chamber, waiting until the wafer has been moved to a multi-slot chamber and then commanding the elevator mechanism 709 associated with the multi-slot chamber to move to a designated slot, both commands can be given simultaneously to speed up the transfer. Indeed, depending on the latency of the elevator mechanism, the elevator mechanism can be commanded to move prior to the wafer transfer mechanism. The synchronization of these two devices reduces the total transfer time over conventional approaches which sequentially command these two devices.

It will be appreciated that although level "0" has been described as being the highest priority level, the priority numbering scheme could of course be inverted such that level "4" would instead be the highest level. Moreover, fewer or more than 5 levels could be used without departing from the scope of the invention. Although various principles of the invention may be practiced through the use of a computer program written in C operating on a general purpose computer, for example, other implementations are of course possible, such as a specialized hardware implementation.

It is apparent that many modifications and variations of the present invention are possible, and references to specific values are by example only. The method steps of the invention may be practiced in a different ordered sequence from that illustrated without departing from the scope of the invention. It is, therefore, to be understood that within the scope of the appended claims the invention may be practiced otherwise than as specifically described.

We claim:

1. A computer-implemented method for transferring wafers in a wafer processing facility comprising a plurality of process chambers, each process chamber for performing a different process on a wafer contained therein, the method comprising the steps of:
   (1) assigning a different priority level to each of a plurality of wafers in the wafer processing facility according to a processing stage to which each respective wafer has progressed through the process chambers;
   (2) determining that a process in one or more of the process chambers has been completed;
   (3) determining which wafer of the plurality of wafers in the one or more process chambers is assigned a highest priority level; and
   (4) initiating a wafer transfer between two of the process chambers for the wafer having the highest assigned priority level,
      wherein the wafer processing facility comprises a cooling chamber for cooling a wafer previously processed in one of the process chambers, wherein step (1) comprises the step of assigning a lower priority level to a wafer which has been transferred to the cooling chamber than to a wafer which has not yet been transferred to the cooling chamber.

2. The method of claim 1, wherein the cooling chamber comprises a plurality of slots for holding a plurality of wafers, the method further comprising the step of, prior to step (4), determining whether a latency associated with the transfer to be initiated in step (4) would exceed a remaining process time for a process occurring in any the plurality of process chambers, and, responsive to a determination that such a latency would exceed the remaining process time, delaying the transfer in step (4).

3. The method of claim 2, further comprising the step of determining whether all of the slots in the multi-slot cooling chamber are full and, responsive to such a determination, transferring one of the wafers from the multi-slot cooling chamber without regard to the latency determination associated with the transfer.

4. A computer-implemented method for transferring wafers in a wafer processing facility comprising a plurality of process chambers, each process chamber for performing a different process on a wafer contained therein, the method comprising the steps of:

(1) assigning a different priority level to each of a plurality of wafers in the wafer processing facility according to a processing stage to which each respective wafer has progressed through the process chambers:

(2) determining that a process in one or more of the process chambers has been completed;

(3) determining which wafer of the plurality of wafers in the one or more process chambers is assigned a highest priority level; and (4) initiating a wafer transfer between two of the process chambers for the wafer having the highest assigned priority level, wherein step (1) comprises the step of assigning a first priority level to a wafer which has already been processed in one of the process chambers, and assigning a second priority level higher than the first priority level to a wafer which is a "dummy" wafer used to clean one of the process chambers.

5. A computer-implemented method for transferring wafers in a wafer processing facility comprising a plurality of process chambers, each process chamber for performing a different process on a wafer contained therein, the method comprising the steps of:

(1) assigning a different priority level to each of a plurality of wafers in the wafer processing facility according to a processing stage to which each respective wafer has progressed through the process chambers;

(2) determining that a process in one or more of the process chambers has been completed;

(3) determining which wafer of the plurality of wafers in the one or more process chambers is assigned a highest priority level; and (4) initiating a wafer transfer between two of the process chambers for the wafer having the highest assigned priority level, wherein step (1) comprises the step of assigning a first priority level to a wafer which has been cooled, a second priority level higher than the first priority level to a wafer which has not yet been processed in any of the process chambers, and a third priority level higher than both the first and second priority levels to a "revisit" wafer which has been processed in one of the processing chambers and requires further processing in another one of the processing chambers.

6. Apparatus for transferring wafers in a wafer processing facility comprising a plurality of process chambers, each process chamber for performing a different process on a wafer contained therein, the apparatus comprising:

means for assigning a different priority level to each of a plurality of wafers in the wafer processing facility according to a processing stage to which each respective wafer has progressed through the processing chambers;

means for determining that a process in one of the process chambers has been completed and for determining which wafer of the plurality of wafers in the one or more process chambers is assigned a highest priority level; and means for initiating a wafer transfer between two of the process chambers for the wafer having the highest assigned priority level, wherein the wafer processing facility comprises a cooling chamber for cooling a wafer previously processed in one of the process chambers, and wherein the means for assigning assigns a lower priority level to a wafer which has been transferred to the cooling chamber than to a wafer which has not yet been transferred to the cooling chamber.

7. Apparatus for transferring wafers in a wafer processing facility comprising a plurality of process chambers, each process chamber for performing a different process on a wafer contained therein, the apparatus comprising:

means for assigning a different priority level to each of a plurality of wafers in the wafer processing facility according to a processing stage to which each respective wafer has progressed through the processing chambers;

means for determining that a process in one of the process chambers has been completed and for determining which wafer of the plurality of wafers in the one or more process chambers is assigned a highest priority level; and means for initiating a wafer transfer between two of the process chambers for the wafer having the highest assigned priority level, wherein the means for assigning assigns a first priority level to a wafer which has been cooled, a second priority level higher than the first priority level to a wafer which has not yet been processed in any of the process chambers, and a third priority level higher than both the first and second priority levels to a "revisit" wafer which has been processed in one of the processing chambers and requires further processing in another one of the processing chambers.

8. A wafer processing facility comprising:

a plurality of process chambers, each process chamber for performing a different process on a wafer contained therein;

a wafer dispensing mechanism which holds and dispenses wafers from a plurality of stored unprocessed wafers;

a wafer transfer mechanism, operable to transfer wafers between any two of the process chambers and between the wafer dispensing mechanism and any one of the process chambers;

a computer coupled to the wafer transfer mechanism and programmed to assign a different priority level to each of a plurality of wafers in the wafer processing facility according to a processing stage to which each respective wafer has progressed through the processing chambers, and programmed to command the wafer transfer mechanism to initiate a wafer transfer between two of the process chambers or between the wafer dispensing mechanism and any one of the process chambers for one of the plurality of wafers having the highest assigned priority level; and a cool down chamber for storing a wafer which is to be cooled;

wherein the computer is programmed to assign a lower priority level to a wafer which has been transferred to the cool down chamber than to an unprocessed wafer.

9. The wafer processing facility of claim 8, wherein the cool down chamber comprises a plurality of slots for holding a plurality of wafers, and wherein the computer is programmed to determine whether a latency associated with the wafer transfer to be initiated would exceed a remaining process time for a process occurring in any the plurality of process chambers, and, responsive to a determination that such a latency would exceed the remaining process time, delaying the wafer transfer.

10. The wafer processing facility of claim 8, further comprising a cooling gas generator, coupled to the cooling chamber, for increasing the cooling rate of wafers stored therein.

11. A wafer processing facility comprising:
   a plurality of process chambers, each process chamber for performing a different process on a wafer contained therein under computer control;
   a wafer dispensing mechanism which holds and dispenses a wafer from a plurality of stored unprocessed wafers;
   a multi-slot wafer cool down chamber having a plurality of slots for holding a plurality of wafers during a cool down period;
   a computer-controlled wafer transfer mechanism, operable to transfer wafers among the process chambers, the wafer dispensing mechanism, and the multi-slot cool down chamber, and
   means for determining whether a latency associated with the wafer transfer to be initiated would exceed a remaining process time for a process occurring in any of the plurality of process chambers, and responsive to a determination that such a latency would exceed the remaining process time, delaying the wafer transfer.

12. The wafer processing facility of claim 11, further comprising a cooling gas generator coupled to the multi-slot wafer cool down chamber, for increasing the cooling rate of wafers stored therein.

13. The wafer processing facility of claim 11, further comprising a computer-controlled elevator mechanism which moves a wafer slot into position to receive or dispense a wafer as part of a wafer transfer, wherein the elevator mechanism is actuated prior to or concurrently with the initiation of the wafer transfer.

14. A computer readable medium having a computer program encoded therein, the computer program comprising:
   means for assigning a different priority level to each of a plurality of wafers in a wafer processing facility according to a processing stage to which each respective wafer has progressed through a plurality of process chambers;
   means for determining which wafer of the plurality of wafers in the one or more process chambers is assigned a highest priority level; and
   means for initiating a wafer transfer between two of the process chambers for the wafer having the highest assigned priority level,
      wherein the wafer processing facility comprises a cooling chamber for cooling a wafer previously processed in one of the process chambers, and wherein the computer program assigns a lower priority level to a wafer which has been transferred to the cooling chamber than to a wafer which has not yet been transferred to the cooling chamber.

15. The computer readable medium of claim 14, wherein the computer program determines whether a latency associated with the wafer transfer to be initiated would exceed a remaining process time for a process occurring in any the plurality of process chambers, and, responsive to a determination that such a latency would exceed the remaining process time, delaying the transfer.

16. A computer-implemented method for transferring wafers in a wafer processing facility comprising a plurality of process chambers wherein at least one chamber is a cooling chamber, each process chamber for performing a different process on a wafer contained therein, the method comprising the steps of:
   (1) assigning a different priority level to each of a plurality of wafers in the wafer processing facility according to a processing stage to which each respective wafer has progressed through the process chambers,
      wherein a lower priority level is assigned to a wafer which has been transferred to a cooling chamber than to a wafer which has not yet been transferred to the cooling chamber;
   (2 storing the priority levels assigned in said step (1) in a process controller:
   (3) determining which wafer of the plurality of wafers in the one or more process chambers is assigned a highest priority level; and
   (4) initiating a wafer transfer between two of the process chambers for the wafer having the highest assigned priority level,
      wherein the cooling chamber comprises a plurality of slots for holding a plurality of wafers, the method further comprising the step of, prior to step (4), determining whether a latency associated with the transfer to be initiated in step (4) would exceed a remaining process time for a process occurring in any the plurality of process chambers, and, responsive to a determination that such a latency would exceed the remaining process time, delaying the transfer in step (4).

17. The method of claim 16, further comprising the step of determining whether all of the slots in the multi-slot cooling chamber are full and, responsive to such a determination, transferring one of the wafers from the multi-slot cooling chamber without regard to the latency determination associated with the transfer.

18. A computer-implemented method for transferring wafers in a wafer processing facility comprising a plurality of process chambers wherein at least one chamber is a cooling chamber, each process chamber for performing a different process on a wafer contained therein, the method comprising the steps of:
   (1) assigning a different priority level to each of a plurality of wafers in the wafer processing facility according to a processing stage to which each respective wafer has progressed through the process chambers,
      wherein a lower priority level is assigned to a wafer which has been transferred to a cooling chamber than to a wafer which has not yet been transferred to the cooling chamber;
   (2) storing the priority levels assigned in said step (1) in a process controller;
   (3) determining which wafer of the plurality of wafers in the one or more process chambers is assigned a highest priority level;
   (4) initiating a wafer transfer between two of the process chambers for the wafer having the highest assigned priority level,
      wherein step (1) comprises the step of assigning a first priority level to a wafer which has been cooled, a second priority level higher than the first priority level to a wafer which has not yet been processed in any of the process chambers, and a third priority level higher than both the first and second priority levels to a "revisit" wafer which has been processed in one of the processing chambers and requires further processing in another one of the processing chambers.

19. Apparatus for transferring wafers in a wafer processing facility comprising a plurality of process chambers, each process chamber for performing a different process on a wafer contained therein, the apparatus comprising:

a prioritization assignor, said prioritization assignor having a process controller, wherein said prioritization assignor assigns a different priority level to each of a plurality of wafers in the wafer processing facility according to a processing stage to which each respective wafer has progressed through the processing chambers;

a completion detector, said completion detector utilizing said process controller, wherein said completion detector determines that a process in one of the process chambers has been completed and determines which wafer of the plurality of wafers in the one or more process chambers is assigned a highest priority level; and a wafer transporter, wherein said wafer transporter comprises a transport arm, and initiates a wafer transfer between two of the process chambers for the wafer having the highest assigned priority level.

20. The apparatus of claim 19, wherein the wafer processing facility comprises a cooling chamber for cooling a wafer previously processed in one of the process chambers, and wherein the prioritization assignor assigns a lower priority level to a wafer which has been transferred to the cooling chamber than to a wafer which has not yet been transferred to the cooling chamber.

21. The apparatus of claim 19, wherein the prioritization assignor assigns a first priority level to a wafer which has been cooled, a second priority level higher than the first priority level to a wafer which has not yet been processed in any of the process chambers, and a third priority level higher than both the first and second priority levels to a "revisit" wafer which has been processed in one of the processing chambers and requires further processing in another one of the processing chambers.

* * * * *